United States Patent

Chen et al.

[11] Patent Number: 5,858,869
[45] Date of Patent: Jan. 12, 1999

[54] METHOD FOR FABRICATING INTERMETAL DIELECTRIC INSULATION USING ANISOTROPIC PLASMA OXIDES AND LOW DIELECTRIC CONSTANT POLYMERS

[75] Inventors: Lai-Juh Chen, Hsin-Chu; Chien-Mei Wang, Taipei, both of Taiwan

[73] Assignee: Industrial Technology Research Institute, Hsin-Chu, Taiwan

[21] Appl. No.: 868,343

[22] Filed: Jun. 3, 1997

[51] Int. Cl.$^6$ .................. H01L 21/44; H01L 21/4763
[52] U.S. Cl. .................. 438/597; 438/618; 438/622
[58] Field of Search .................. 438/597, 518, 438/622, 623, 624, 631, 633

[56] References Cited

U.S. PATENT DOCUMENTS

| 5,366,856 | 11/1994 | Chen et al. | 430/314 |
| 5,461,010 | 10/1995 | Chen et al. | 437/228 |
| 5,486,493 | 1/1996 | Jeng | 437/195 |
| 5,763,954 | 6/1998 | Hyakutake | 257/774 |
| 5,783,481 | 7/1998 | Brennan et al. | 438/623 |

OTHER PUBLICATIONS

Chen et al, "The Anisotropic Plasma–Enhanced Chemical Vapor Deposition SiO2/Spin–On–glass Process for 0.35um Technology", in Japanese Journal of Applied Physics, vol. 32 (1993) pp. 6119–6121.

"International Symposium on VLSI", TSA. 1995, pp. 164–168.

Implemetation of Low–Dielectric Constant Materials for VLSI Circuit Performance Improvement.

"Proceedings from the International Electronic Device Meeting (IEDM)" 1995, p. 244.

Primary Examiner—Joni Chang
Attorney, Agent, or Firm—George O. Saile; Stephen B. Ackerman

[57] ABSTRACT

A method for making multilevel electrical interconnections having a planar intermetal dielectric (IMD) with low dielectric constant k and good thermal conductivity was achieved. The method involves patterning an electrically conductive layer to form metal lines on which is deposited an anisotropic plasma oxide (APO) resulting in a thin oxide on the sidewalls of the metal lines and a much thicker oxide on top of the lines. A low dielectric constant (k) polymer is deposited and the polymer and APO are chem/mech polished back to the top of the metal lines. A fluorine-doped silicon oxide (FSG) is deposited, and via holes are etched to provide electrical connections for the next level of interconnections. The APO provides wider openings between metal lines filled with the low k dielectric polymer thereby reducing the RC time delay of the circuit. The thick top APO provides more processing latitude for polishing back the APO and low k polymer. The FSG provides a lower dielectric constant k for further reducing the RC delay and a better thermal conductivity constant K for minimizing the Joule heating when the circuit is powered up. The process can be repeated several times to form a planar multilevel interconnection for completing wiring on the integrated circuit.

20 Claims, 8 Drawing Sheets

FIG. 1 – Prior Art

METHOD FOR FABRICATING INTERMETAL DIELECTRIC INSULATION USING ANISOTROPIC PLASMA OXIDES AND LOW DIELECTRIC CONSTANT POLYMERS

BACKGROUND OF THE INVENTION

(1) Field of the Invention

The present invention relates to a method for making integrated circuits on semiconductor substrates, and more particularly to a method for forming multilevel wiring on substrates with insulators having a low dielectric constant that reduce the RC time delays. The method is particularly useful for interconnections on ULSI circuits with minimum feature sizes less than 0.5 micrometers (um).

(2) Description of the Prior Art

Integrated circuits fabricated on semiconductor substrates for Ultra Large Scale Integration (ULSI) require multilevels of metal interconnections for electrically interconnecting the discrete semiconductor devices on the semiconductor chips. In the more conventional method the different levels of interconnections are separated by layers of insulating material. These interposed insulating layers have etched via holes which are used to connect one level of metal to the next. Typically, the insulating layer is a silicon oxide ($SiO_2$) having a dielectric constant (relative to vacuum) of about 4.1 to 4.5. However, as the device dimensions decrease and the packing density increases, it is necessary to reduce the spacing between the metal lines in the interconnections to effectively wire up the integrated circuits. Unfortunately, as the spacing decreases, the intra- (on the same metal level) and interlevel (between metal levels) capacitances increase between metal lines when an insulating layer having the same dielectric constant is used since the capacitance C is inversely proportional to the spacing d between the lines ($C=keA/d$ where k is the dielectric coefficient, e is the permittivity of the insulator, A is the area, and d is the spacing between lines). Therefore, it is very desirable to minimize the dielectric constant k in the insulator (dielectric) between the conducting lines to reduce the RC time constant and thereby increase the performance of the circuit (frequency response) since the signal propagation time in the circuit is adversely affected by the RC delay time, where R is the resistance of the metal line, and C is the inter- and/or the intralevel capacitance mentioned above. The dependence of delays due to the gate delays and the interconnects are shown in FIG. 1 reported at the International Symposium on VLSI, TSA, 1995, page 164. As shown in FIG. 1, the curve 1 shows the time delay in nanoseconds of the FET gate minimum feature size (channel length) in um (gate delay) and the curve 2 shows the interconnect delay as a function of the minimum feature size (line spacings). It is clearly seen that as the minimum feature size is reduced below 1.0 um, the interconnection delay (curve 2) becomes the predominant circuit delay. For example, below 0.5 um the gate delay (curve 1) decreases to about 0.1 E-9 seconds while the interconnect delay 2 increases rapidly to about 2.5 E-9 seconds.

One approach to minimize these RC time delays is to use a good electrical conductor for the interconnections, such as replacing aluminium with copper to reduce resistance R, and in addition to use an insulating material that has a lower dielectric constant k, such as an organic, to reduce the capacitance C between lines. The improvement in the interconnect delay can best be understood by the family of curves in the prior art of FIG. 2 (Proceedings from the International Electronic Device Meeting (IEDM), 1995, page 244). The RC expression for a metal line L with a pitch of P and a metal thickness T and an intermetal insulating layer also having a thickness T is given by $RC=2pke_o(4L^2/P^2+L^2/T^2)$, where p is the metal resistivity, k is the relative dielectric constant, and $e_o$ is the permittivity in vacuum. The family of curves is shown for the interconnect RC time delay in nanoseconds (abscissa) as a function of metal thickness in micrometers (ordinate axis) for a metal line pitch of 0.8 um and having 10 mm lengths. FIG. 2 shows the rapid increase in the interconnection delay (nsec.) as the metal thickness T is decreased for a constant pitch P and a metal length L of 0.8 um. The curve 3 is for aluminum (Al) lines having an intralevel dielectric constant k of 4, such as an undoped silicon oxide ($SiO_2$), while curve 4 shows the improvement in delay for comparable patterned copper lines using an insulator having the same dielectric constant k of 4. Curves 5 and 6 show comparable improvement in the delay time for Al and Cu, respectively, using a low k interlevel dielectric of k=2, such as an organic polymer. For example, a number of inorganic and organic dielectrics are listed in TABLE I that can be used to reduce the RC delays.

TABLE I

| | DIELECTRIC CONSTANT |
|---|---|
| INORGANICS | |
| PLASMA $SIO_2$ | 4.1–4.5 |
| FLUORINE-DOPED $SIO_2$ | 3.5 |
| ORGANICS | |
| POLYIMIDE | 3.0–3.7 |
| POLYSILSEQUIOXANE (Si POLYMER) | 2.7–3.0 |
| BENZOCYCLOBUTENE (BCB) | 2.7 |
| PARYLENE N | 2.7 |
| FLUORINATED POLYIMIDE | 2.5 |
| PARYLENE F | 2.3 |
| AMORPHOUS TEFLON | 1.9 |

To better understand the problems associated with using a low dielectric polymer, FIG. 3 is shown having closely spaced metal lines 16 formed on a substrate 10 having a silicon oxide layer 12. A conformal chemical vapor deposited liner 18, such as silicon oxide, is deposited by low temperature chemical vapor deposition (CVD) to protect the metal lines from the low k polymer that typically has high moisture content. The CVD lines also serve to improve the adhesion of the low k polymer 20 which is then deposited. Typically a low dielectric polymer is deposited and planarized to provide an intermetal dielectric (IMD) layer. A hard mask 22 composed of a low temperature CVD is deposited and a photoresist mask 24 is then patterned to form the via holes in the hard mask and in the low k polymer. Typically there are several problems associated with this structure. One is the ability to control the chemical/ mechanical polishing of the polymer to the top of the metal lines 16. Other problems are non-standard via hole etch, outgassing of moisture such as $H_2O$ in the via holes that can cause via poisoning, which can erode the next level of aluminum contacts, and low dielectric breakdown strength and high electrical leakage currents. The low k polymer also has the issue of a low mechanical strength and poor dimensional stability. Another concern is poor thermal stability (<450° C.) that can be exacerbated by the Joule heating of the metal lines from high current density and poor thermal conductivity K of the polymers. For comparison the thermal conductivity of polymers such as polyimide, SOP (spin-on polymer), and HSQ (Hitachi Chemical polymer) are compared with the inorganic oxides plasma-enhanced PETEOS and high-density plasma (HDP) CVD in TABLE II.

TABLE II

| Dielectric Film | Thermal Conductivity K(mW/cm° C.) | Film Thickness (um) |
| --- | --- | --- |
| PETEOS | 11.5 | 0.1–3.8 |
| HDP CVD Oxide | 12.0 | 1.0–1.8 |
| Polyimide | 2.4 | 3.3–9.0 |
| SOP | 2.4 | 0.34–0.5 |
| HSQ | 3.7 | 0.27–0.38 |

As can be seen the oxides have a thermal conductivity K as measured in milliWatts/cm°C which is about 4 to 6 times better than the polymers.

Several methods for forming planarized interconnections using low dielectric constant insulators have been described. For example, Jeng, U.S. Pat. No. 5,486,493, describes a method for forming closely spaced Al or titanium nitride/Al/titanium nitride interconnect lines having a low dielectric constant insulator between metal lines. Another method for making sub-micron metal interconnections using a spin-on glass (SOG) is described by Chen et al., U.S. Pat. No. 5,366,850, in which the SOG is cured and partially etched back to an insulating liner on the metal lines to form a planar surface. A CVD oxide is then deposited and contacts are etched to the metal lines without exposing the SOG. Chen et. al., in the Japanese Journal of Applied Physics, Vol 32 (1993) pp. 6119–6121, entitled "The Anisotropic Plasma-Enhanced Chemical Vapor Deposition $SiO_2$/Spin-on Glass Process for 0.35 um Technology" teaches a method for forming an intermetal dielectric for sub-micrometer metal interconnections.

As the spacings between interconnecting metal lines are further reduced, such as in future 0.18–0.13 micrometer technologies, it becomes increasingly difficult to provide an insulating layer having a low dielectric constant between adjacent metal lines and further to provide good thermal conductivity for cooling the circuit. There is also a need for providing a process with greater latitude for forming a planar low k dielectric layer, which is free of poisoned via holes (outgassing problems) that can degrade the metal contacts. Therefore there is still a strong need in the semiconductor industry for providing a simplified method for forming multilevel metal interconnections having reduced inter- and intralevel capacitance to reduce the RC time constant that improves circuit performance.

SUMMARY OF THE INVENTION

A principal object of the present invention is to provide an anisotropic plasma oxide liner which enhances the gap-filling between the very closely spaced metal interconnections with a low dielectric constant (k) insulator, thereby providing low RC time delays for integrated circuits.

It is another object of this invention to use an anisotropic plasma oxide which allows the low k polymers (insulators) to be chemical/mechanically polished back with greater processing latitude.

A further object of this invention is to provide a stable fluorine-doped silicon oxide (FSG) having a low dielectric constant between the interlevel metallurgy to further reduce the RC time constant for the multilevel interconnections on integrated circuits and to provide better thermal cooling for the chip.

In accordance with the objects of this invention, a new method is achieved for forming multilevel interconnections with planar low dielectric constant insulators over a semiconductor substrate having partially completed semiconductor device structures, such as field effect transistors (FETs). An insulating layer is deposited over the semiconductor devices having contact openings to the devices. A barrier layer such as titanium (Ti)/titanium nitride (TiN) or titanium tungsten (TiW) is deposited to prevent penetration of the Al into the shallow junctions of the devices. A first conductive layer, such as aluminum (Al), aluminum copper (AlCu), or Cu is deposited over the insulating layer and in the contact openings to regions of the semiconductor devices. The first conductive layer is patterned to form the interconnections for the devices. An anisotropic plasma oxide is deposited over the patterned first conductive layer. The anisotropic plasma oxide is deposited, which is thicker on the top surface than on the sidewalls of the conductive layer, having a ratio between the sidewall oxide thickness and top oxide thickness of about 0.17. This allows one to form more closely spaced conductive lines with a low dielectric constant insulator therebetween. A low dielectric constant insulator, composed of an organic material, such as a polymer, is deposited on the anisotropic plasma oxide. The low dielectric constant insulator is chemical/mechanically polished essentially down to and into the anisotropic plasma oxide to the top surface of the patterned first conductive layer to form a planarized surface. To further reduce the RC delay time between conductive layers and to minimize via poisoning, a fluorine-doped oxide, also having a relatively low dielectric constant of about 3.5, is deposited on the planar low dielectric insulator and on the exposed top surface of the patterned first conductive layer. Via holes are then etched in the fluorine-doped oxide to the first conductive layer to provide contacts for the second level of metal interconnections. A second conductive layer, such as Al, Al/Cu, or Cu, is deposited on the fluorine-doped oxide and in the via holes, and is patterned to form the second level of metal interconnections. The process can be repeated to form additional levels of planar metal interconnections to complete the wiring of integrated circuits having these low RC time delays.

BRIEF DESCRIPTION OF THE DRAWINGS

The objectives and other advantages of this invention are best understood with reference to the preferred embodiment and drawings.

DESCRIPTION OF THE PREFERRED EMBODIMENT

Figure 1:
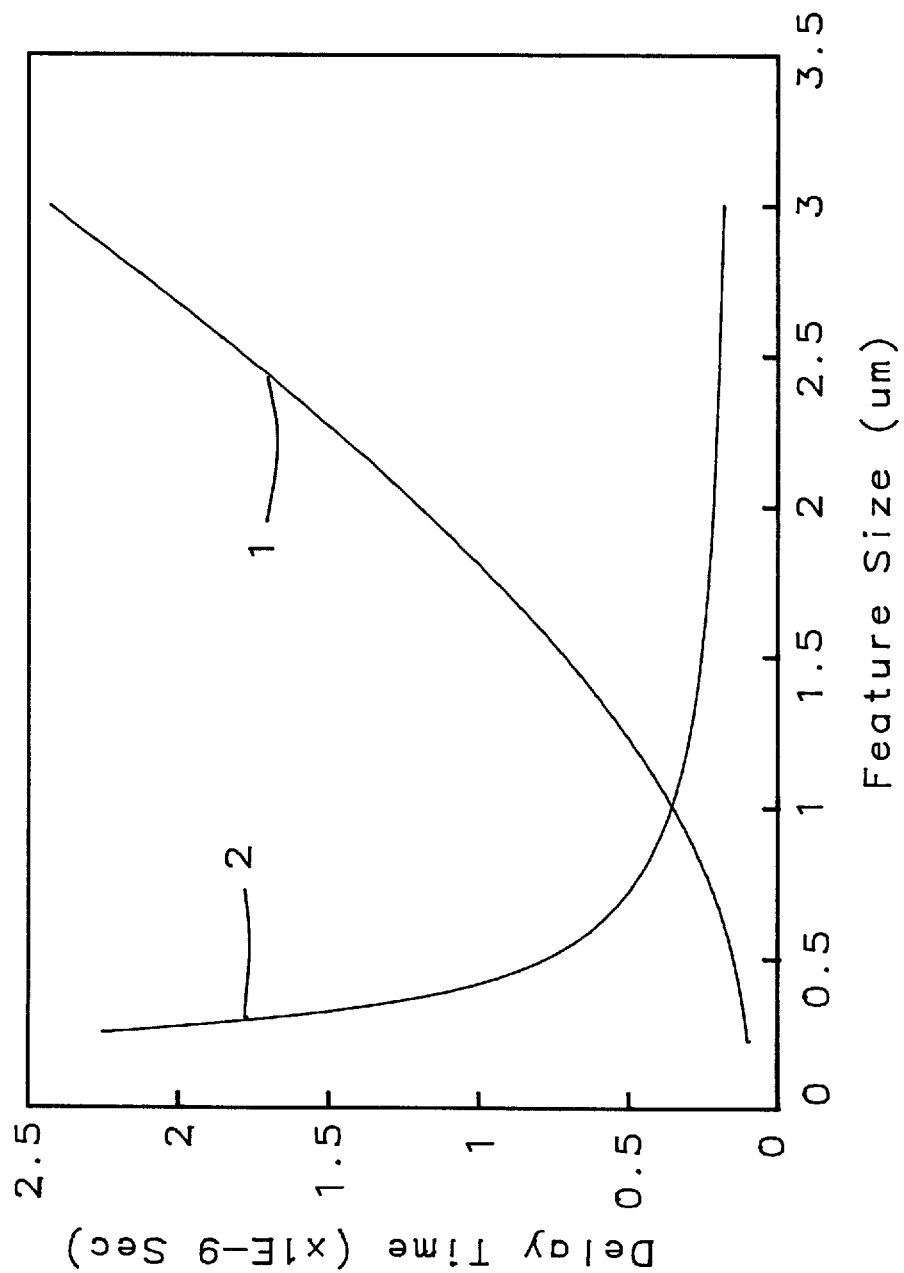
FIG. 1 is a graph showing the dependence of the RC time delay for metal interconnections and gate electrode delay of an FET as a function of minimum feature size (um).
Figure 2:
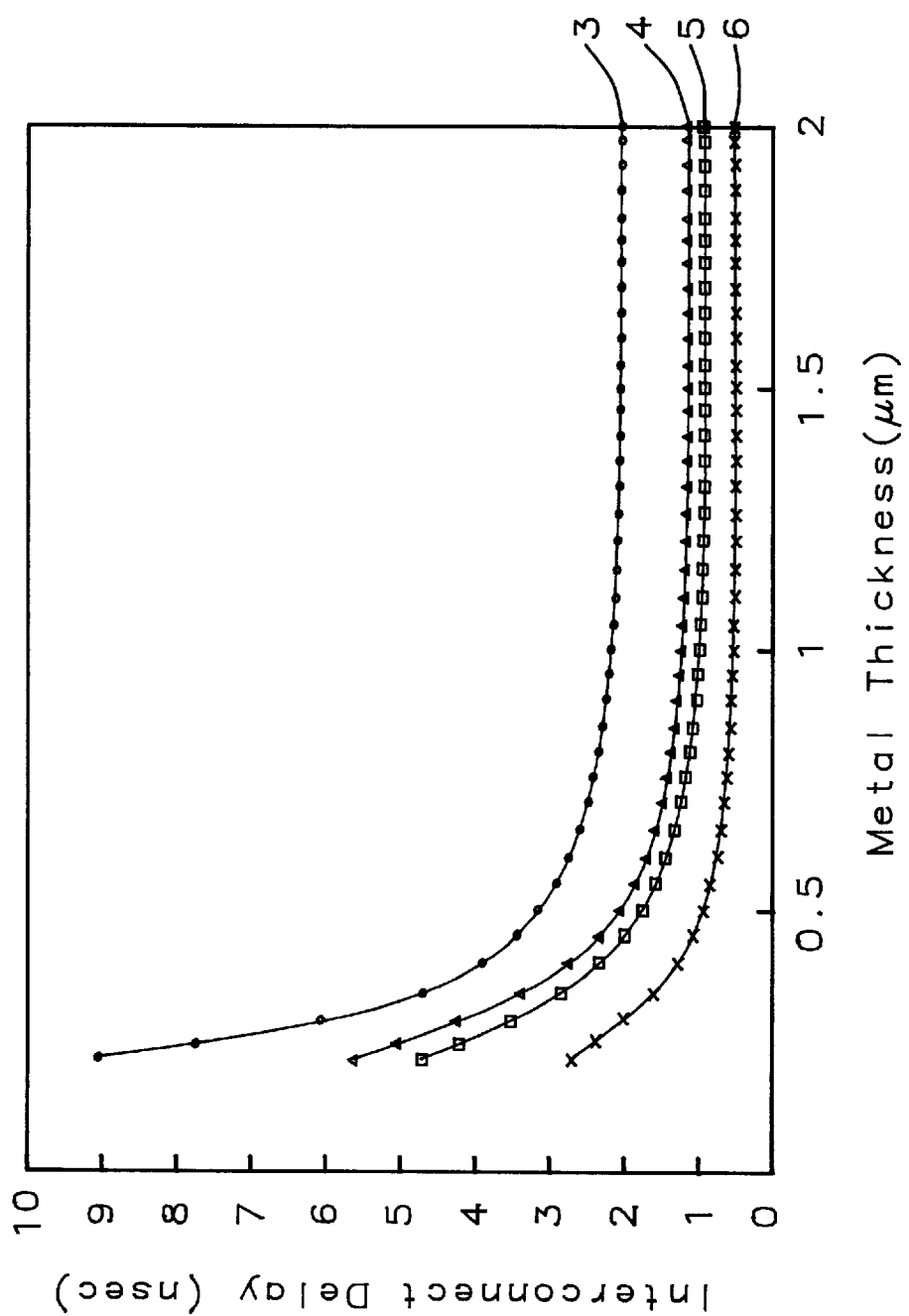
FIG. 2 is a graph showing the rapid increase in the RC interconnection delays (nsec) as a function of metal thickness for thicknesses less than 0.5 um. Also shown is the dependence on the dielectric constant of the insulator and the electrical conductivity of the metals Al and Cu.
Figure 3:
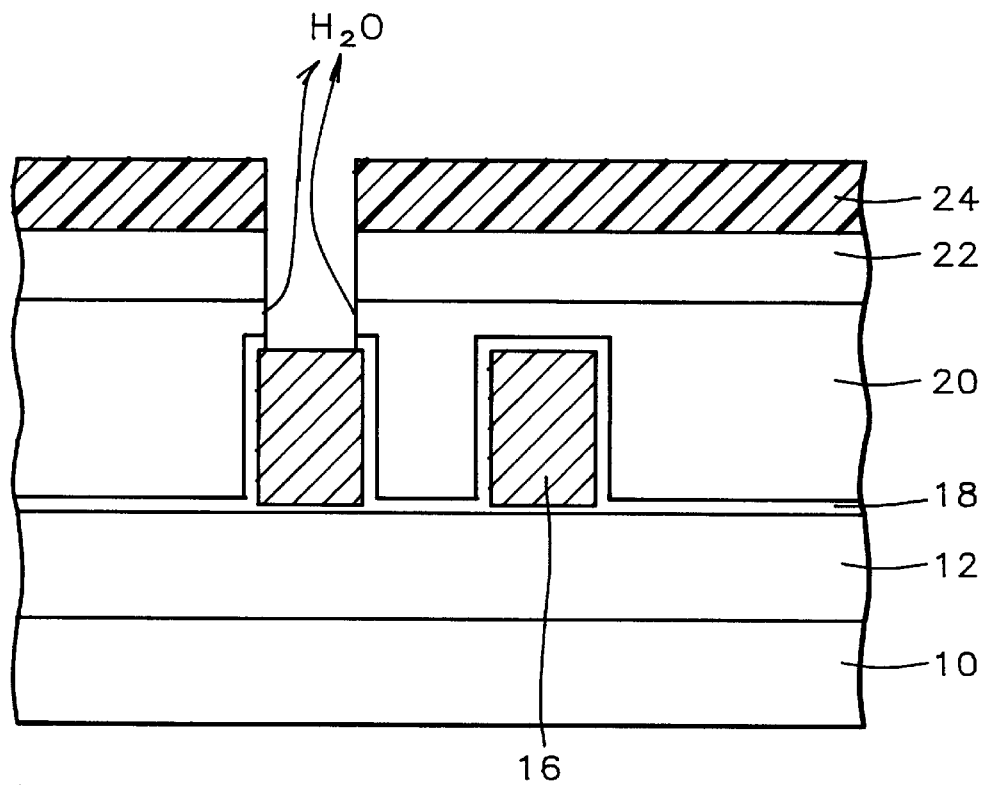
FIG. 3 is a schematic cross-sectional view of a single level of metal interconnections depicting some of the current limitations of the prior art.

The present invention relates to a method for fabricating low dielectric constant polymer intermetal dielectrics using anisotropic plasma oxide for metal interconnections on semiconductor substrates for ULSI circuits. The method utilizes an anisotropic plasma oxide to form a very thin oxide on the sidewalls of metal interconnection, which allows the line pitch to be significantly reduced thereby allowing the spacings to be filled with a low dielectric polymer. The thicker anisotropic plasma oxide on the top of the metal lines allows greater latitude in controlling the chem/mech polishing used to planarize the insulating layer. A fluoride-doped oxide between metal levels is used to further reduce the RC delay and to minimize via poisoning Referring now to FIG. 4, an insulating layer 12, is deposited on the semiconductor substrate 10 over the semiconductor devices to electrically insulate the devices from the first level of interconnections. Layer 12 is typically deposited by low pressure chemical vapor deposition (LPCVD) using a reactant gas such as tetraethosiloxane (TEOS), and is typically deposited to a thickness of between about 2000 and 20000 Angstroms. Contact openings are etched by conventional photolithographic to the devices, but are not shown in the Figs. to simplify the drawings and description. A barrier layer, also not depicted in the drawings, such as titanium (Ti), titanium nitride (TiN), or titanium tungsten (TiW) is deposited to prevent penetration of Al into the shallow diffused junctions of the devices when the first level of interconnections is formed next. Alternatively, metal plugs, such as tungsten, can be formed in the contact openings be provide electrical contacts to the devices.

Figure 4:
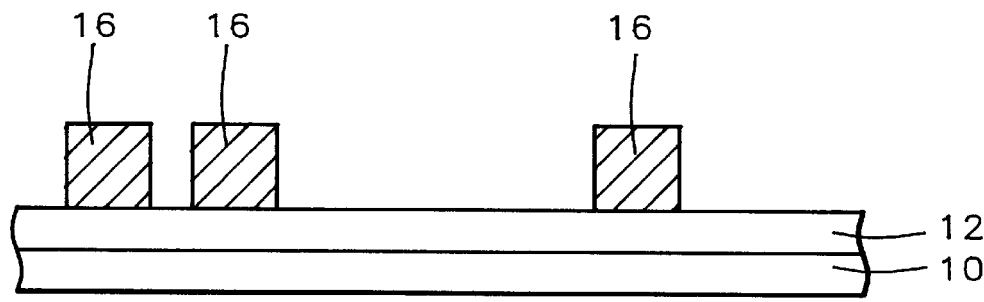
FIGS. 4 through 9 are schematic cross-sectional views showing the sequence of process steps for planar metal interconnections, by the method of this invention, having the improved intermetal low dielectric material.

Still referring to FIG. 4, a first conductive layer 16, such as aluminum (Al), aluminum copper (AlCu), or copper (Cu), is deposited over the insulating layer 12 and in the contact openings (not shown) to regions of the semiconductor devices. Preferably the first conductive layer 16 is deposited by physical vapor deposition (PVD) or by sputter deposition to a thickness of between about 3000 and 10000 Angstroms. The first conductive layer 16 is then patterned by conventional photolithographic techniques and anisotropic plasma etching to form the interconnecting metal lines 16 for the devices. Typically for patterning Al or Al/Cu layers, the anisotropic plasma etching can be carried out in a reactive ion etcher (RIE) using a reactant gas containing chlorine ($Cl_2$) and a carrier gas such as argon (Ar).

Figure 5:
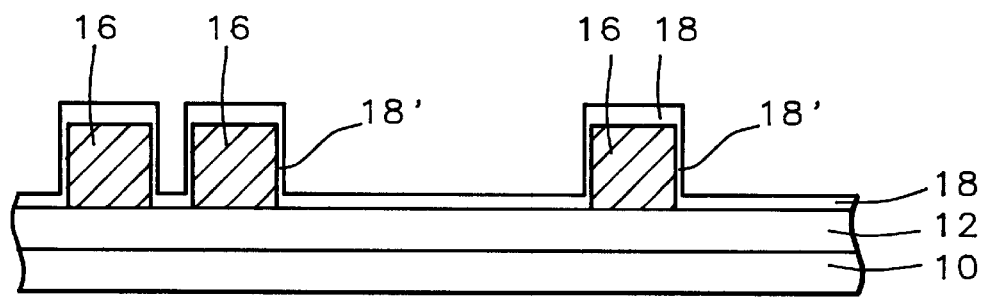

Referring now to FIG. 5, an intermetal dielectric (IMD) layer is formed by first depositing an anisotropic plasma oxide (APO) 18 over the metal lines 16. The anisotropic plasma oxide is deposited preferably by using a TEOS/$O_2$ chemistry resulting in a thicker oxide on the top surface of the metal lines 16 than on the sidewalls. For example, the APO can have a ratio of oxide thicknesses on the sidewalls (18') of the metal lines to the oxide thickness on the top of the metal lines of about 0.1 to 0.5, and more specifically a ratio of 0.17. The APO layer 18 can be deposited, for example, from the reaction of TEOS with a helium/oxygen mixture in a parallel-plate RF plasma reactor. The APO layer is achieved by using a low oxygen flow rate, for example, the ratio of $O_2$ to TEOS flow rate can range between about 0 and 0.3. Preferably the APO can be deposited to a thickness of between about 1000 and 5000 Angstroms on the top of the metal lines, resulting in a sidewall coverage of between about 200 and 900 Angstroms, respectively. This provides a larger opening between the metal lines 16 for filling with a low dielectric constant insulator, such as a polymer, to reduce RC time delays.

Figure 6:
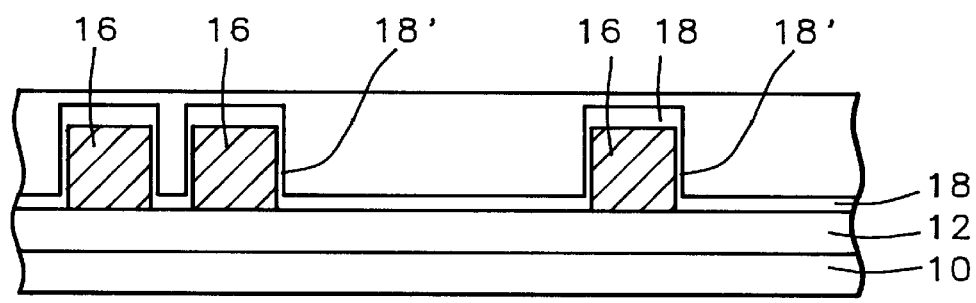

Referring to FIG. 6, a low dielectric constant (k) insulator 20, composed of an organic material, such as a polymer, is deposited over the anisotropic plasma oxide layer 18 to a thickness sufficient to fill the openings between the metal lines 16, and more specifically to a thickness of between about 2000 and 20000 Angstroms. Preferably the low k layer 20 can be one of the organic materials, such as a polyimide. Alternatively other low k materials such as polysilsequioxane (Si polymer), benzocyclobutene (BCB), fluorinated polyimide, and the like can be used to fill the openings. The low k polymer can be deposited, for example, by spin coating at a spin speed of between about 2000 and 4000 revolutions per minute (RPM), and is baked or annealed at a temperature of between about 80° and 450° C. for 0.5 to 2.0 minutes to cure the polymer.

Figure 7:
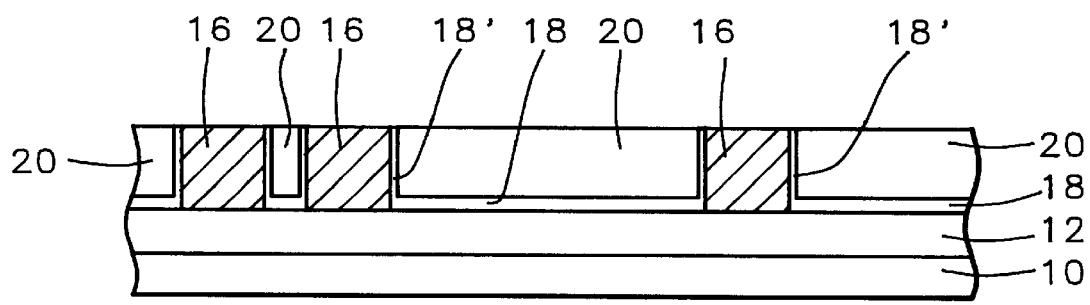
Figure 13:
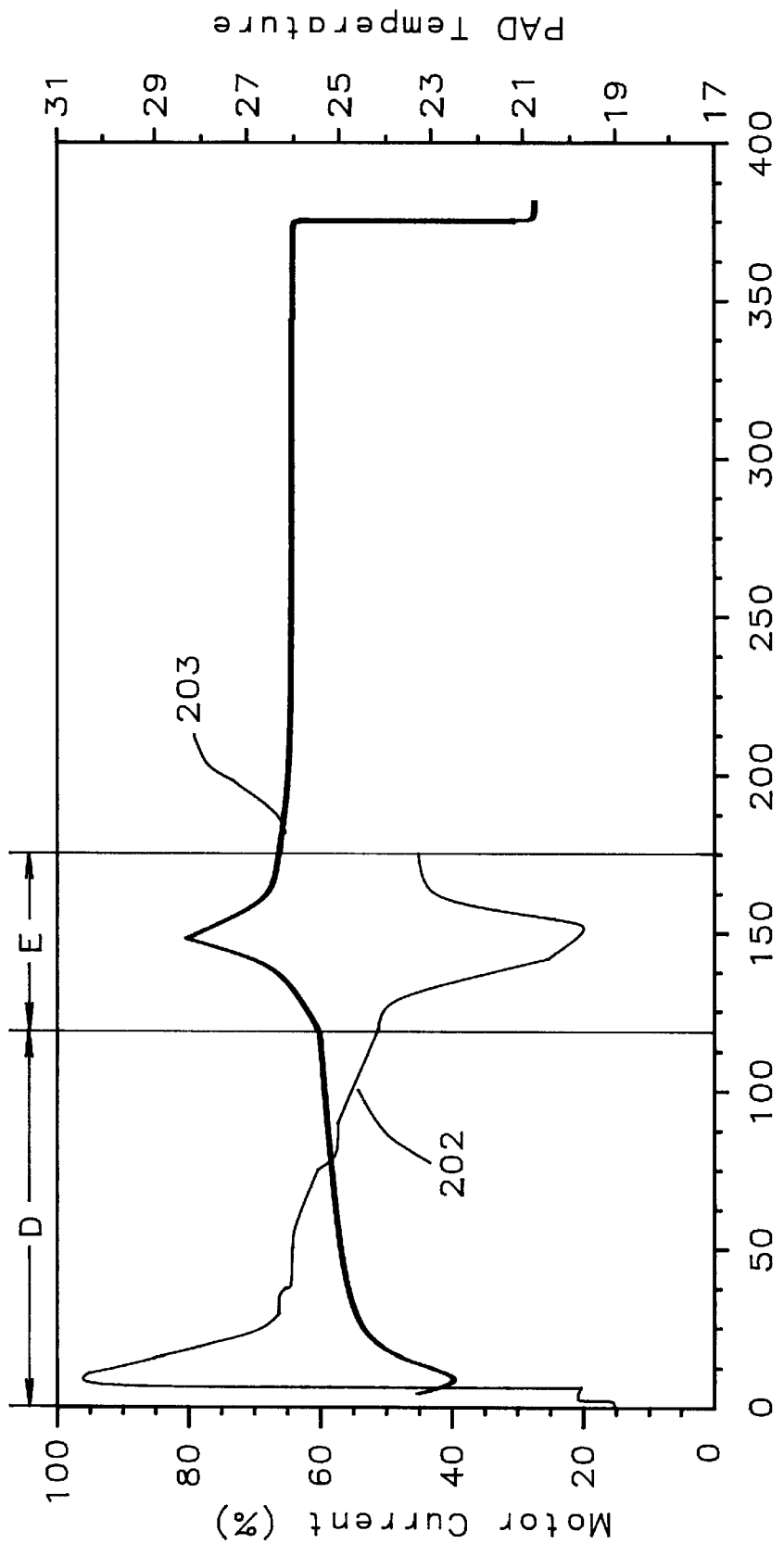
FIG. 13 is a graph of the endpoint detect trace for the chemical/mechanical polishing back to planarize the low dielectric polymer and the anisotropic plasma oxide.

Referring next to FIG. 7, the low dielectric constant insulator 20 and the top portion of the anisotropic plasma oxide (APO) is polished back to the top surface of the metal lines 16 using chemical/mechanical polishing to provide a global planarized surface. Because of the thicker APO layer 18 on the top surface of the metal lines 16, it is easier to control the chemical/mechanical polishing (CMP) by providing a wider process window when the APO is polished back to the metal lines 16, as shown by the endpoint detect curves in FIG. 13. The endpoint graph shown in FIG. 13 shows the change in motor current (curve 200), and the change in pad temperature (curve 202) during polishing, either of which can be used to determine the endpoint for the polishing. Region E is the polish back in the low k insulator (20 in FIG. 7) and the polishing through the thicker anisotropic plasma oxide (18 in FIG. 7) on the top surface of the metal lines (16 in FIG. 7), which allows greater latitude in polishing time during removal of the APO in region D, while still providing a very thin APO (18' in FIG. 7) on the sidewalls of the metal lines. The abscissa (Y axis) on the left side of the graph shows the percent change in the motor current, while the abscissa on the right side of the graph shows the change in pad temperature in degrees Celsius. The ordinate (X axis) shows the polishing time in seconds.

Figure 8:
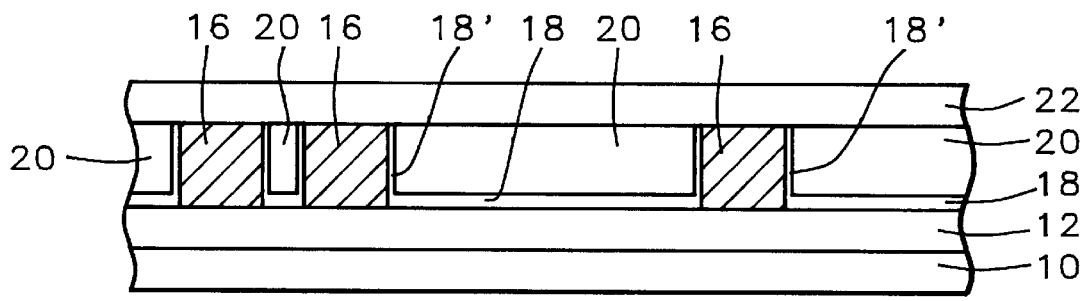

Referring now to FIG. 8, a fluorine-doped oxide (FSG) layer 22, also having a relatively low dielectric constant k of about 0.35, is deposited over the planarized low dielectric insulator 20 and on the exposed top surface of the metal lines 16 formed from the patterned first conductive layer. Preferably layer 22 is deposited to a thickness of between about 2000 and 10000 Angstroms. The fluorine-doped oxide layer 22 is preferably formed by using plasma-enhanced chemical vapor deposition (PECVD), or a high-density plasma-enhanced CVD (HDPECVD), and a reactant gas such as TEOS to deposit a silicon oxide ($SiO_2$), and doping the $SiO_2$ with fluorine (F). Preferably the oxide is deposited at a temperature in the range of about 200° to 500° C. One method of doping the $SiO_2$ is by ion implanting F ions after the $SiO_2$ deposition, but preferably the method of doping the $SiO_2$ is by in-situ doping during the PECVD or HDPECVD using a reactant gas such as one of the following fluorine-containing gases: $CF_4$, $SiF_4$, $C_2F_6$, $Si_2F_4$, or $SF_6$. Preferably the fluorine-doped oxide 22 is doped to a concentration of between about 2 and 8 atomic percent. Preferably the FSG is deposited in a reactor at a power of between about 400 and 600 Watts, at a pressure of between about 5 and 11 Torr using a gas mixture of about 600 sccm of TEOS, 900 sccm of $O_2$, and 100 to 200 sccm of $C_2F_6$. The fluorine-doped oxide further reduces the RC delay time between the electrically conductive layers and minimizes via poisoning. The F-doped glass 22 has a much better thermal conductivity K than the low dielectric constant (k) polymers, and therefore is much more effective in removing the heat generated by the electric current (Joule heating) in the metal lines when the device is powered up.

Figure 9:
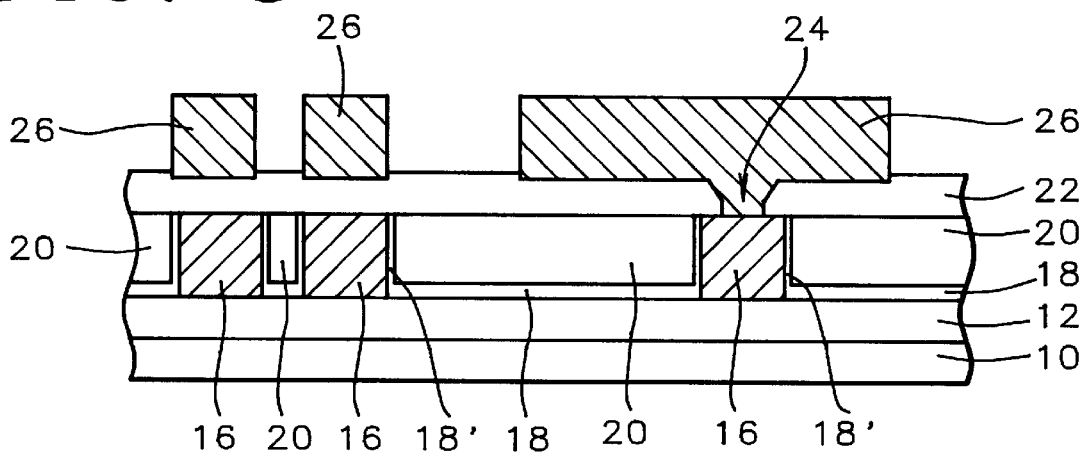

Referring next to FIG. 9, using conventional photolithographic techniques and anisotropic plasma etching, via holes 24 are etched in the FSG layer 22 to the metal lines 16 to provide contacts for the second level of metal interconnections. A second conductive layer 26, such as Al, Al/Cu, or Cu, is deposited on the fluorine-doped oxide 22 and in the via holes 24. Layer 26 is deposited similar to the deposition of the first conductive layer 16, for example, using physical vapor deposition, and to a thickness of between about 2000 and 20000 Angstroms. Layer 26 is patterned, for example, using reactive ion etching and a reactant gas mixture containing a chlorine ($Cl_2$) species and a carrier gas such as argon (Ar), to form the second level of metal interconnections.

The process steps for forming the planar low k intermetal dielectric (IMD) can be repeated to form additional levels of planar metal interconnections to complete the wiring of integrated circuits having these low RC time delays.

Figure 10:
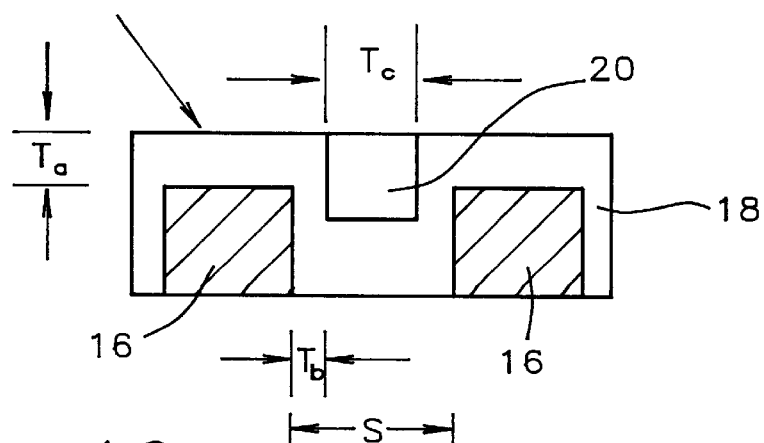
FIG. 10 is a cross-sectional view of two adjacent metal lines that depicts the conventional use of PECVD oxide and low dielectric constant materials for making the intermetal dielectric layers.
Figure 11:
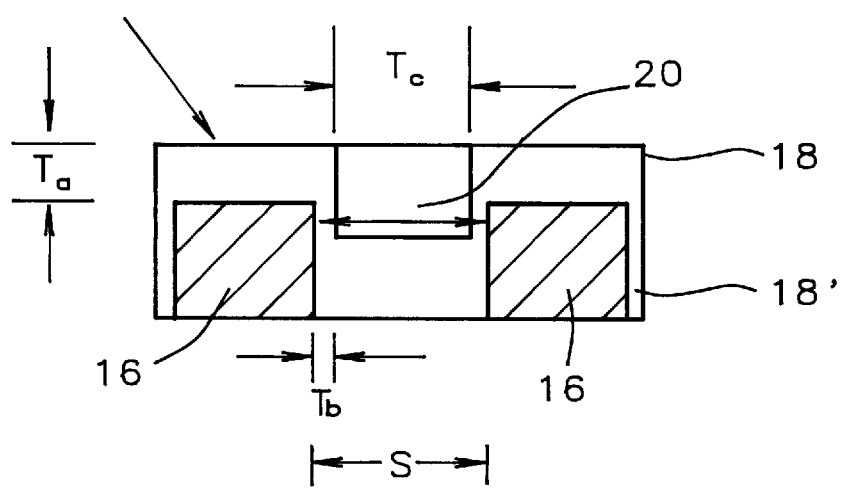
FIG. 11 is a cross-sectional view of two adjacent metal lines that depicts the improved intermetal dielectric layer using anisotropic plasma oxide and fluorinated oxide, by the method of this invention.

The advantages of the anisotropic plasma oxide deposited over the conventional PECVD for low dielectric (k) insulators is best understood by reference to FIG. 10 for the conventional PECVD barrier oxide, and FIG. 11 for the anisotropic PECVD oxide by the method of this invention.

dimensions $T_a$ show the thickness of the PECVD oxide over the metal, and $T_b$ shows the thickness of the PECVD oxide on the sidewalls of the metal lines. $T_c$ is the resulting gap formed between the adjacent metal lines, which is filled with the low k dielectric. FIG. 11 shows the corresponding adjacent metal lines 16 using the anisotropic PECVD oxide 18. Now, as can be seen in FIG. 11, the anisotropic PECVD oxide provides a much narrower sidewall oxide 18' having a width $T_b$, which allows for a wider opening $T_c$ that the low k polymer can fill. This reduces the RC time delay. TABLES III and IV show a comparison of the resulting spacings $T_c$ filled with the low k constant for a series of top oxide thicknesses $T_a$ between 1000 and 5000 Angstroms. For the conventional PECVD (TABLE III) and the anisotropic plasma oxide (TABLE IV), the first column, rows 1–5 is for the top oxide thickness ($T_a$) of the PECVD oxide in Angstroms. Col. 2, rows 1–5 show the corresponding ratio of the thickness of the sidewall oxide to the thickness of the top oxide ($T_a/T_b$), and Col. 3, rows 1–5 show the resulting PECVD sidewall thickness $T_b$ in Angstroms. Cols. 4–9, rows 1–5 show the corresponding openings $T_c$ in Angstroms for spacings of S=0.2 to 0.7 um between the metal lines. It is clearly seen from TABLES III and IV that for metal spacings S between 0.2 and 0.7 um, the anisotropic PECVD oxide provides much wider openings $T_c$ for the low k polymer. For example, TABLE III shows that for spacing S=0.2 um and a $T_a$ of 2000 Angstroms, the opening $T_c$ is 0 width, and for S=0.3 um and a $T_a$ of 2000 Angstroms, the opening $T_c$ is only 400 Angstroms by the conventional method. Now as shown in TABLE IV for the anisotropic plasma oxide, the openings $T_c$ for the corresponding $T_a$ thickness of 2000 Angstroms and metal spacing S of 0.2 and 0.3 um, the openings $T_c$ are much wider having a width of 1320 and 2320 Angstroms, respectively. This allows one, by the method of this invention, to make more closely spaced lines having insulators with lower dielectric constants therebetween.

TABLE III

| col. | 1 | 2 | 3 | 4 | 5 | 6 | 7 | 8 | 9 |
|---|---|---|---|---|---|---|---|---|---|
| | | | | \multicolumn{6}{c}{metal spacing S (um)} | | | | | |
| row | $T_a$ | $T_a/T_b$ | $T_b$ | 0.7 | 0.6 | 0.5 | 0.4 | 0.3 | 0.2 |
| 1 | 1000 | 0.65 | 650 | 5700 | 4700 | 3700 | 2700 | 1700 | 700 |
| 2 | 2000 | 0.65 | 1300 | 4400 | 3400 | 2400 | 1400 | 400 | 0 |
| 3 | 3000 | 0.65 | 1950 | 3100 | 2100 | 1100 | 100 | 0 | 0 |
| 4 | 4000 | 0.65 | 2600 | 1800 | 800 | 0 | 0 | 0 | 0 |
| 5 | 5000 | 0.65 | 3250 | 500 | 0 | 0 | 0 | 0 | 0 |

TABLE IV

| col. | 1 | 2 | 3 | 4 | 5 | 6 | 7 | 8 | 9 |
|---|---|---|---|---|---|---|---|---|---|
| row | $T_a$ | $T_a/T_b$ | $T_b$ | 0.7 | 0.6 | 0.5 | 0.4 | 0.3 | 0.2 |
| 1 | 1000 | 0.17 | 170 | 6660 | 5660 | 4660 | 3660 | 2660 | 1660 |
| 2 | 2000 | 0.17 | 340 | 6320 | 5320 | 4320 | 3320 | 2320 | 1320 |
| 3 | 3000 | 0.17 | 510 | 5980 | 4980 | 3980 | 2980 | 1980 | 980 |
| 4 | 4000 | 0.17 | 680 | 5640 | 4640 | 3640 | 2640 | 1640 | 640 |
| 5 | 5000 | 0.17 | 850 | 5300 | 4300 | 3330 | 2330 | 1330 | 300 |

Figure 12:
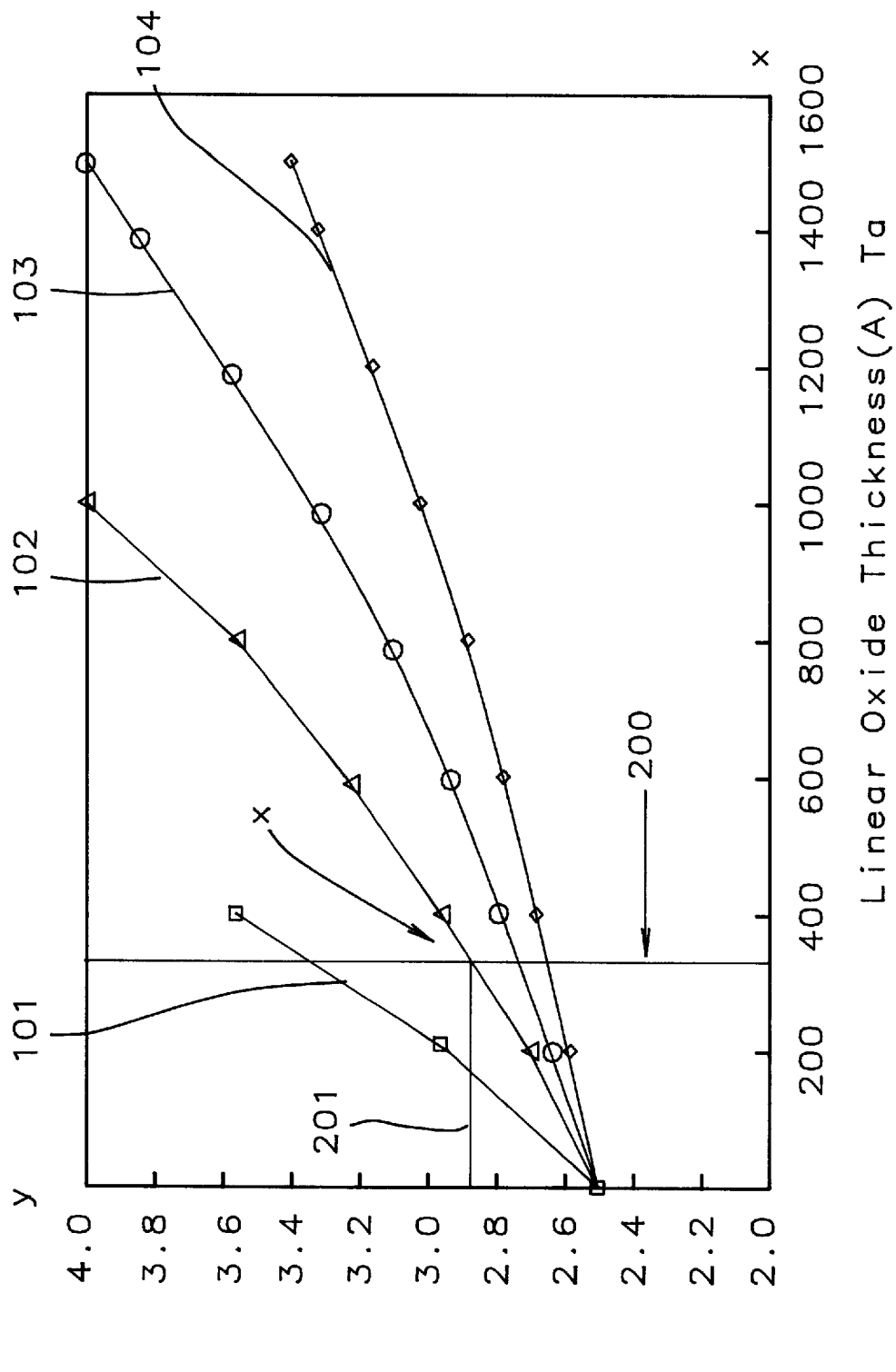
FIG. 12 is a graph of the effective dielectric constant between metal lines as a function of the silicon oxide sidewall thickness on metal lines having a low dielectric material in the openings between the lines.

FIG. 10 depicts a cross-sectional view of two adjacent metal lines 16 with a spacing S using the conventional PECVD layer 18 filled with a low k dielectric polymer 20. The Referring to FIG. 12, the effective dielectric constant k for the insulator between metal lines is shown as a function of the linear oxide thickness $T_b$ for four different metal spacings. Curve 101 is for S=1000 Angstroms, curve 102 is for 2000 Angstroms, curve 103 is for 3000 Angstroms, and curve 104 is for 4000 Angstroms. For example, if the anisotropic plasma oxide (18 in FIG. 11) is deposited to a thickness of 2000 Angstroms, the sidewall oxide $T_b$ (18' in FIG. 11) is only 340 Angstroms thick and provides a opening $T_c$ of 1320 Angstroms. As shown in FIG. 12 where the vertical line 200 at 340 Angstroms thickness intersects the curve 102, represents an effective dielectric constant of only about 2.85 where the horizontal line 201 intersects the Y-axis. By the conventional PECVD method, the $T_b$ is 1300 Angstroms and completely fills the opening $T_c$ between the metal lines having a spacing S of 2000 Angstroms since the total oxide thickness is $2 \times T_b$. This results in a much higher dielectric constant resulting from the CVD oxide (k=4.0) and also results in longer RC delay times.

While the invention has been particularly shown and described with reference to the preferred embodiments thereof, it will be understood by those skilled in the art that various changes in form and details may be made without departing from the spirit and scope of the invention.

What is claimed is:

1. A method for fabricating multilevel metal interconnections having low dielectric constant insulators on a substrate comprising the steps of:
   a. providing a semiconductor substrate having semiconductor devices having contacts protected by a barrier layer;
   b. depositing a first conductive layer for-contacting regions of said devices;
   c. patterning said first conductive layer to form interconnections for said devices;
   d. depositing an anisotropic plasma oxide over said patterned first conductive layer, said anisotropic plasma oxide being thicker on the top surface than on the sidewalls of said patterned conductive layer;
   e. depositing a low dielectric constant insulator on said anisotropic plasma oxide;
   f. planarizing said low dielectric constant insulator down to and further planarizing into said anisotropic plasma oxide by chemical/mechanical polishing to said top surface of said patterned first conductive layer;
   g. depositing a fluorine-doped oxide on said low dielectric insulator on said patterned first conductive layer;
   h. forming via holes in said fluorine-doped oxide to said patterned first conductive layer;
   i. depositing a second conductive layer on said fluorine-doped oxide and in said via holes;
   j. patterning said second conductive layer to form a second level of metal interconnections.

2. The method of claim 1, wherein said barrier layer is composed of titanium/titanium nitride and prevents aluminum from penetrating said devices having said contacts.

3. The method of claim 1, wherein said conductive layer is aluminum.

4. The method of claim 1, wherein said anisotropic plasma oxide is a silicon oxide deposited by plasma-enhanced chemical vapor deposition at a temperature of between about 375° and 425° C. using tetraethosiloxane (TEOS) and oxygen.

5. The method of claim 1, wherein said anisotropic plasma oxide is deposited to a thickness of between about 1000 and 5000 Angstroms on top surface of said patterned conductive layer, resulting in a respective thickness of said anisotropic oxide on the sidewalls of said patterned conductive layer of between about 170 and 850 Angstroms.

6. The method of claim 1, wherein said low dielectric constant insulating layer is an organic material having a dielectric constant of between about 1.9 and 3.7.

7. The method of claim 6, wherein said organic material is comprised of a polymer selected from a group consisting of polyimide, polysilsequioxane, benzocyclobutene (BCB), parylene N, fluorinated polyimide, parylene F, and amorphous Teflon.

8. The method of claim 1, wherein said low dielectric constant insulating layer is deposited to a thickness sufficient to fill the openings in said patterned conductive layer.

9. The method of claim 1, wherein said fluorine-doped oxide is a silicon oxide deposited by chemical vapor deposition to a thickness of between about 2000 and 10000 Angstroms.

10. The method of claim 1, wherein said fluorine-doped oxide has a fluorine concentration of between about 2 and 8 atomic percent and a dielectric constant of between about 3.8 and 3.1.

11. A method for fabricating multilevel metal interconnections having low dielectric constant insulators on a substrate comprising the steps of:
   a. providing a semiconductor substrate having semiconductor devices having contacts protected by a barrier layer;
   b. depositing a conductive layer for contacting regions of said devices;
   c. patterning said conductive layer to form interconnections for said devices;
   d. depositing an anisotropic plasma oxide over said patterned conductive layer, said anisotropic plasma oxide being thicker on the top surface than on the sidewalls of said patterned conductive layer;
   e. depositing a low dielectric constant insulator on said anisotropic plasma oxide;
   f. planarizing said low dielectric constant insulator down to and further planarizing into said anisotropic plasma oxide by chemical/mechanical polishing to said top surface of said patterned conductive layer;
   g. depositing a fluorine-doped oxide on said low dielectric insulator on said patterned conductive layer;
   h. forming via holes in said fluorine-doped oxide to said patterned conductive layer;
   i. performing elements b. through h. n times, where n is the number of said patterned conductive layers required to complete said multilevel metal interconnections on an integrated circuit.

12. The method of claim 11, wherein said barrier layer is composed of titanium/titanium nitride and prevents aluminum from penetrating said devices having said contacts.

13. The method of claim 11, wherein said conductive layer is aluminum.

14. The method of claim 11, wherein said anisotropic plasma oxide is a silicon oxide deposited by plasma enhanced chemical vapor deposition at a temperature of between about 375° and 425° C. using tetraethosiloxane (TEOS) and oxygen.

15. The method of claim 11, wherein said anisotropic plasma oxide is deposited to a thickness of between about 1000 and 5000 Angstroms on top surface of said patterned conductive layer, resulting in a respective thickness of said anisotropic oxide on the sidewalls of said patterned conductive layer of between about 170 and 850 Angstroms.

16. The method of claim 11, wherein said low dielectric constant insulating layer is an organic material having a dielectric constant of between about 1.9 and 3.7.

17. The method of claim 16, wherein said organic material is comprised of a polymer selected from a group consisting of polyimide, polysilsequioxane, benzocyclobutene (BCB), parylene N, fluorinated polyimide, parylene F, and amorphous Teflon.

18. The method of claim 11, wherein said low dielectric constant insulating layer is deposited to a thickness sufficient to fill the openings in said patterned conductive layer.

19. The method of claim 11, wherein said fluorine-doped oxide is a silicon oxide deposited by chemical vapor deposition to a thickness of between about 2000 and 10000 Angstroms.

20. The method of claim 11, wherein said fluorine-doped oxide has a fluorine concentration of between about 2 and 8 atomic percent and a dielectric constant of between about 3.8 and 3.1.

* * * * *